United States Patent [19]

Lebailly et al.

[11] 3,852,797

[45] Dec. 3, 1974

[54] ELECTROLUMINESCENT SEMICONDUCTOR DEVICE

[75] Inventors: Jacques Lebailly; Jean-Claude Dubois, both of Caen, France

[73] Assignee: U.S. Philips Corporation, New York, N.Y.

[22] Filed: Mar. 7, 1973

[21] Appl. No.: 338,841

[30] Foreign Application Priority Data

Mar. 14, 1972 France .............................. 72.08826

[52] U.S. Cl. ........................ 357/19, 357/17, 357/16, 250/211 J

[51] Int. Cl. .............................................. H01l 15/00

[58] Field of Search ..... 317/235 N, 235 AC, 235 R; 250/211 J

[56] References Cited

UNITED STATES PATENTS

| | | | |
|---|---|---|---|
| 3,535,532 | 10/1970 | Merryman | 250/217 |
| 3,537,029 | 10/1970 | Kressel | 331/94.5 |
| 3,697,833 | 10/1972 | Nakata | 317/235 R |
| 3,728,593 | 4/1973 | Coleman | 317/235 R |
| 3,737,741 | 6/1973 | Bortelink | 317/235 R |
| 3,748,480 | 7/1973 | Coleman | 250/211 J |

*Primary Examiner*—Martin H. Edlow
*Attorney, Agent, or Firm*—Frank R. Trifari

[57] ABSTRACT

Electroluminescent semiconductor device with brightness control comprising an electroluminescent diode and three transistor regions one of which is made from a material having a forbidden band distance which is smaller than the energy of the radiation emitted by the diode, and one region separates the diode optically from a photoconductive region which is destined to receive radiation other than that of the diode.

10 Claims, 3 Drawing Figures

ELECTROLUMINESCENT SEMICONDUCTOR DEVICE

BACKGROUND OF THE INVENTION

The present invention relates to a monolithic semiconductor device having four successive regions of alternately p and n conductivity type which together constitute three p-n junctions, the first p-n junction between the first region and the second region having electroluminescent properties and the first region and the fourth region comprising ohmic contact electrodes.

Semiconductor devices with four successive regions of alternate conductivity type are frequently used and are referred to as thyristors. Some of these can be brought in a conductive condition by means of optic radiation and devices of this type have also been proposed in which one of the junctions is an electroluminescent junction which is optically coupled to the photosensitive element of the device. Such a device which is described, for example, in French Pat. No. 1,409,138, indeed has a current-voltage characteristic having a negative slope and two stable operating conditions. In one of the embodiments of this device, another junction is also an electroluminescent junction but it radiates towards the outside; as a result of this an electroluminescent device is obtained which uses the transistor effect and which has two very different brightness levels which can be switched by means of radiation from without. As a result of this, said device can fulfil the requirements of a reproduction which necessitates two brightness levels.

In the cases in which a range of intermediate levels must be obtained according to the incident radiation, the device having a negative resistance characteristic cannot be used.

It is the object of the present invention to enable the control of electroluminescent radiation by a radiation or an illumination of different wavelength, in which the control device is integrated in the electroluminescent device.

SUMMARY OF THE INVENTION

The invention uses on the one hand the transistor effect which permits of obtaining an amplification, on the other hand uses the electroluminescent properties of certain p-n junctions. Moreover the invention uses the photosensitive properties of phototransistors.

According to the invention, the monolithic semiconductor device having four successive regions of alternately p and n conductivity type which together constitute three p-n junctions, the first junction between the first region and the second region having electroluminescent properties and the first region and fourth region comprising ohmic contact electrodes, is characterized in that the second region comprises at least two zones, one of which adjoins the first region and has the same composition as said first region and another zone of which adjoins the third region and optically separates the latter from the first junction and is made from a material having a forbidden bandwidth which is smaller than the energy of the photons emitted by the said first junction, the third region being made from a material having photoconductive properties and showing a surface which is admissible to the photons originating from outside the device.

The second zone of the second region adjoining the third region constitutes a screen for the photons emitted by the junction due to the forbidden bandwidth of the material which forms the second zone. When the device is connected to a voltage source in which the voltage applied between the two contact electrodes for the first and the third junction is in the forward direction, the photons emitted by the first junction are absorbed in the said second zone and cannot reach the third region.

On the other hand, the photons of radiation from outside the device are received by said third region and a part thereof lands at least in the depletion zone of the second junction (which is biased in the reverse direction) and in said third region, and there form electron-hole pairs. The formation of carriers at a distance from the second junction which is smaller than their diffusion length adds minority carriers in the third region, which turns out to have for its result an alteration of the potential of the latter relative to the fourth region. The potential limit of the third junction is reduced, which enables the injection of minority carriers from the fourth region into the third region.

If the distance between the second junction and the third junction is small enough, a smaller number of said carriers recombine in the third region and are compensated by the arrival of photons. As a result of this an amplification effect is obtained of the type of transistor effect in which the second zone of the second region constitutes the collector of the phototransistor, the third region constitutes the base and the fourth region constitutes the emitter. The primary photo-current in the base of the transistor is equal to the product of the photon current which reaches the photosensitive region, the quantum efficiency of the formation of electron-hole pairs in said region and the value of the charge of the electron.

The current in the device is equal to said photocurrent in the third region or base multiplied by the amplification of the transistor at the current level in question. Said current thus varies with the illumination of the base region the surface of which is exposed to radiation from without. On the contrary, the radiation emitted in the direction of the transistor by the first junction, which is luminescent, does not influence said photocurrent, since the second zone of the second region is impervious to said radiation. The gain of the transistor can be estimated according to the usual method and is substantially equal to the ratio between the diffusion length of the minority carriers in the base and the thickness of the base which lies between the second and the third junction.

On the other hand, it is known that, for an important operating range, the curve of the power emitted by an electroluminescent diode as a function of the current which it allows to pass may usually be assumed to be equal to a straight line. As a result of this a variation of the brightness of the device is obtained which is substantially proportional to the photocurrent received by the photosensitive part which it contains. The device according to the invention herewith performs a control of the intensity of the radiation which is emitted as a function of the intensity of the radiation received. It is possible to vary the brightness of the device as well without varying the supply voltage by means of an adapted source of radiation. Moreover, the device is selective, the choice of the material of the various zones and of the various emitter or photosensitive regions enabling a selection in the wavelength of the received and emitted radiation.

The invention may also serve to convert the wavelength of a radiation, and a combination of devices according to the invention may serve as an image converter for visualizing in particular infrared radiation.

In order that the invention may be readily carried into effect, it will now be described in greater detail, by way of example, with reference to the accompanying drawings in which:

PREFERRED EMBODIMENT

Figure 1:
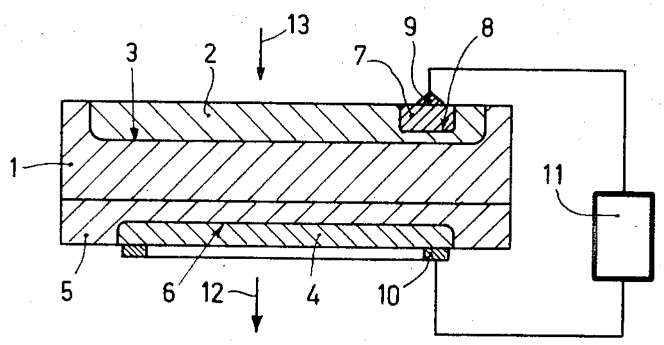
FIG. 1 is a diagrammatic sectional view of a device according to the invention in a first embodiment.

In a preferred embodiment of the semiconductor device according to the invention the difference in the forbidden bandwidth between the material of the second zone of the second region and that of the region of the electroluminescent diode is caused by a difference in concentration of the common constituent of materials which have the same crystal system and crystal parameters located close to each other, the crystal lattices thus being compatible. Gallium and gallium arsenide $Ga_{1-x}Al_xAs$, in which $0 < x < 0.4$, an example of materials which provide epitaxial deposits having the desired forbidden bandwidth, which may lie between that of gallium arsenide, and that of aluminium arsenide dependent upon the concentrations of aluminium and gallium.

In certain cases it is necessary for the manufacture of a monolithic device having two materials of different forbidden bandwidths and crystal constants lying near each other, to perform the epitaxial deposition of one material on the other with the interposition of an intermediate layer, a so-called buffer layer, the composition of which gradually increases between that of the two materials. The forbidden bandwidth in the buffer layer varies gradually with the composition and said buffer layer may preferably be an integrate part of the second region. The device consists, for example, of a first region and a first zone of the second region which are manufactured from gallium arsenide phosphide $GaAs_{1-x}P_x$, a second zone of the second region manufactured from gallium arsenide phosphide, in which second zone the phosphide concentration decreases from x to 0, such decrease being along the thickness of the second zone in the direction away from the first zone, and third and fourth regions of gallium arsenide. The second zone may in addition consist partly of semiconductor gallium arsenide.

Since the light emission of the electroluminescent device according to the invention varies as a function of the illumination which it receives, display devices may be manufactured having contrast control by the ambient light. The material of the first region and of the first zone of the second region is selected so that the junction therebetween, biased in the forward direction, emits a visible radiation, such material being for example, gallium-arsenide and aluminum arsenide. The material of the second zone of the second region is a material having a lower forbidden bandwidth, for example gallium arsenide, which may also form the material of the third region and of the fourth region. This material is also sensitive to infrared radiation having a wavelength exceeding 0.9 micron as most of the natural or artificial light contains, and moreover it is highly absorbant for radiations having a shorter wavelength, such as the radiation emitted by the diodes manufactured from the above-mentioned materials. Other materials which are composed of at least one element of Group III of the periodic table of elements and at least one element of Group V are also suitable. Gallium phosphide and indium phosphide, $Ga_{1-x}In_xP$, for example in combination with indium phosphide has such a lower forbidden bandwidth.

The device according to the invention which receives infrared radiation can emit light in the visible spectrum and thus can serve as a wavelength converter infrared signals. A combination of several devices of this type constitutes an image converter in the form of, e.g., a mosaic of coplanar devices according to the invention which is provided on a common support in, for example, an XY matrix.

The structure of the device preferably is a flat structure which is obtained by epitaxial deposits and diffusions, possibly by alloying or ion implantation.

The thicknesses of the first (i.e., the surface) region and of the second region are minimum. The thickness of the radiation absorbing part (i.e., the second zone) of the second region is determined according to the absorption coefficient $\alpha$ thereof, for the radiation emitted by the junction, such thickness preferably being at least equal to three times the absorption distance $1/\alpha$ which corresponds to an attenuation of the incident strength in the proportion $1/e$ for the radiation emitted by the junction.

When the material of the first region and of the second zone of the second region is a semiconductor material having a direct band structure from which the photo emissions are caused by direct recombinations between conductivity band and valence band, the absorption by the material of the emitted light is considerable. For example, an n-type region is sometimes impervious to radiation which is emitted by an adjacent electroluminescent p-n junction, which junction must then irradiate via a very thin p-region. For this purpose the junction is manufactured in a material having a direct band structure resulting from strong doping on either side of the junction. In a particular embodiment, the device according to the invention comprises a p-n junction which is manufactured in a strongly doped direct band material, the junction being defined by the first (surface) region (which is a p-type region), and the first zone of the second region (which is of the n-type) is sufficiently thick to adsorb the emitted radiation itself.

In a first embodiment, the device face from which the radiation emitted by the first junction originates, is situated opposite to the side penetrated by the radiation received by the third region and the regions and the zones are layers placed one on top of the other, the fourth region of which has a very restricted extent relative to the other regions, and in particular to the third region, whose outer surface has a maximum extent.

In a second embodiment the surface from which the radiation emitted by the first electroluminescent junction originates is the same as the surface through which the radiation which there enters the third region must receive. The third region is reached only by radiation having a smaller energy than the forbidden band of the material of the second region first zone which is traversed by said radiation. In that case, the assembly of the traversed zones and regions has a minimum thickness, so as not to absorb too large a part of said radiation. If desired, an intermediate zone of a material having a forbidden bandwidth which lies between that of the material of the said second zone and the energy of the photons emitted by the first junction is provided between the first and the second zone of the second region. Such as intermediate zone constitutes a selective absorbing layer.

In a third embodiment which corresponds to a so-called lateral structure, the radiation emitted by the first junction leaves the device through the device face which receives the light which is destined to form electron-hole pairs in the third region but the emanating surfaces differ from the receiving surfaces. According to this measure, the diode and the transistor which constitute the device are placed beside each other and are coplanar or at least present in adjacent parallel planes.

The device according to the invention may be manufactured according to the usual methods. The known methods of photo-etching, epitaxy, diffusion, alloying, ion implantation may be used. The device may be manufactured, for example, starting from a plate of a monocrystalline III-V compound. The first zone of the second region is deposited epitaxially on said plate; it consists of a differently composed material the crystal lattice of which corresponds to that of the first material. The first region is diffused in said first zone. The third region is diffused in the plate and the fourth region is manufactured by alloying or ion implantation.

The invention may be used in all cases in which the light power of an electroluminescent reproduction is to be controlled as a function of a radiation, in particular in the cases in which a light power of an electroluminescent diode is to be controlled as a function of the ambient illumination.

The device shown in FIG. 1 comprises a first region 4 and a second region 1–5. An electroluminescent junction 6 which transmits radiation in the direction 12 is present between the first and second regions 4, 1-5. The second region comprises two zones, a first zone 5 of the same material as the first region but of opposite conductivity type, and a second zone 1 of a material having a smaller forbidden bandwidth. A third region 2 constitutes with the second region a second p-n junction 3, and a fourth region 7 constitutes with the third region a third p-n junction 8. The third region 2 shows a great outer surface for receiving radiation 13 incident from without. Contacts are provided at 10 on the first region and at 9 on the fourth region and are connected to a low and constant voltage source 11.

Figure 2:
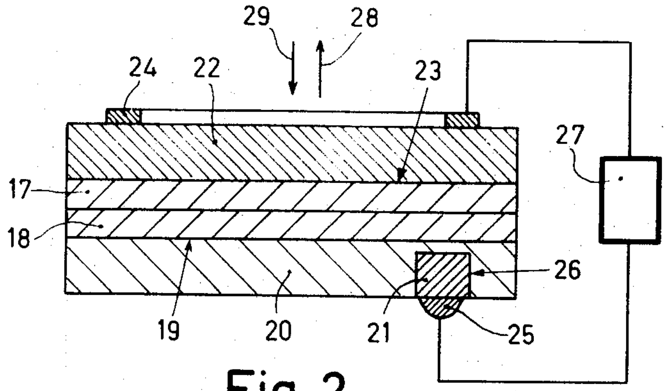
FIG. 2 is a diagrammatic sectional view of a second embodiment of the invention.

The device shown in FIG. 2 comprises a first region 22, a second region 17 – 18 of opposite conductivity type, in which the junction 23 between said two regions has electroluminescent properties. The first zone 17 of the second region is made from the same material as the region 22 and the second zone 18 of said second region is made from a material having a smaller forbidden bandwidth. A third region 20 constitutes with the zone 18 a second p-n junction 19 and a fourth region 21 constitutes with the third region a third p-n junction 26; the zones 17 and 18 are sufficiently thin so as not to absorb the part of the radiation 29 incident from without to which the material of the third region 20 is sensitive. Contacts are provided at 24 on the region 22 and at 25 on the region 21; these contacts are connected to a voltage source 27.

Figure 3:
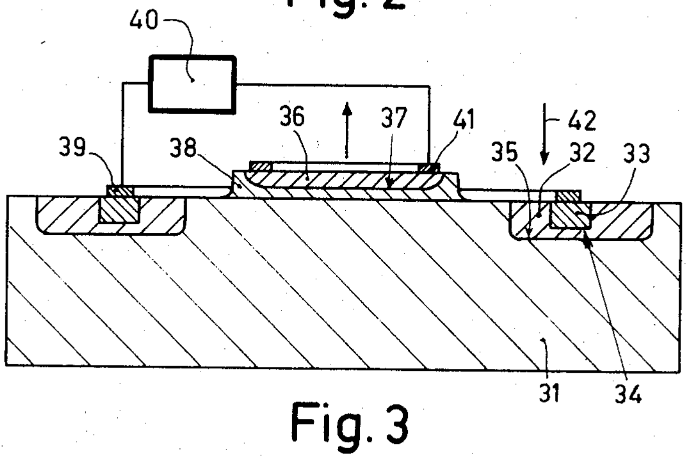
FIG. 3 is a diagrammatic sectional view of a third embodiment of the invention.

The device shown in FIG. 3 comprises a first region 36 and a second region 38 – 31, of opposite conductivity type, in which the junction 37 between the regions 36 and 38 has electroluminescent properties. The second region comprises two zones, a zone 38 of the same material as the region 36 and a zone 31 of a material having a smaller forbidden bandwidth. A third region 32 constitutes with the region 31 a second p-n junction 35 and a fourth region 33 constitutes with the region 32 a third p-n junction 34. The region 32 has a large outer surface on which radiation 42 can be incident. Contacts are provided at 39 on the region 33 and at 41 on the region 36; these contacts are connected to a voltage source 40. The region 32, the region 33 and the contacts 39 and 41 are preferably annular.

A device as shown in FIG. 1 may be manufactured starting from III–V semiconductor compounds having the desired properties. The device may be manufactured, for example, starting from a plate of gallium arsenide-GaAs of the n-type which is doped with tellurium in a concentration in the order of $10^{17}$ atoms per $cm^3$ which forms the substrate 1. The region 2 or base region is obtained by zinc diffusion with a thickness which is smaller than or equal to two microns, with a concentration in the order of $10^{18}$ per $cm^3$. The region 7 of the emitter is obtained by tin alloy which penetrates approximately 1.5 microns and leaves a base thickness between the emitter and collector of half a micron. On the other hand the electroluminescent diode which is constituted by the regions 4 and 5 is provided epitaxially. It is obtained by the epitaxial deposition on the substrate 1 of gallium arsenide phosphide $GaAs_{1-x}P_x$, in which $x$ varies between 0 and 0.4 with a thickness of 40 microns. The deposited compound is of the n-type having a concentration of $5 \times 10^{17}$ selenium atoms or tellurium atoms per $cm^3$. The region 4 is a diffused region which is obtained by zinc diffusion in a concentration in the order of $10^{19}$ atoms per $cm^3$ with a depth of 2 microns. The flat surface of the junction 6 is much smaller than the flat surface of the junction 3: the electroluminescent junction 6, for example, has a flat circular surface of $10^{-3}$ $cm^2$ and the flat part, which is parallel to the preceding, of the junction 3 has a surface of $10^{-1}$ $cm^2$.

A device manufactured according to the above description shows a transistor gain in the order of 10 to 50. With an infrared radiation incident from without of the receiving face of 50 m W/$cm^2$, the current in the diode is 30 mA in which the base current is in the order of 1.5 mA. With an illumination of 5 mW/$cm^2$ the current in the diode is 3 mA. The brightness of the diode between said two illumination values varies proportionally with a factor of approximately 10.

What is claimed is:

1. A monolithic semiconductor device comprising four successive regions of alternately p and n conductivity type which together constitute three p-n junctions, the first p-n junction between first and second ones of said regions having electroluminescent properties and said first region and a fourth one of said regions comprising ohmic contact electrodes, a second one of said regions comprising at least two zones, a first one of said zones adjoining said first region and having the same composition as said first region and a second one of said zones adjoining a third one of said regions and substantially isolating optically said third region from the first junction, said second zone consisting essentially of a material having a forbidden energy bandgap corresponding to an energy level which is smaller than the energy of the photons emitted by said first junction, and said third region consisting essentially of a material having photoconductive properties and comprising a surface that admits photons originating outside the device.

2. A device as claimed in claim 1, wherein material of said first region and of the first zone of the second region on the one hand and, on the other hand, material of the second zone of the second region and of the third and fourth regions consist essentially of common constituents in different respective concentrations and belong in the same crystal system, said materials having relatively close crystal parameters.

3. A device as claimed in claim 2, wherein said second region further comprises a buffer zone disposed between and adjoining said first and second zones and comprising constituents whose concentrations vary gradually between the values of the respective concentration level in said zones.

4. A device as claimed in claim 1, wherein the thickness of said second zone is equal to at least three times the absorption distance $1/\alpha$ for the radiation emitted by the first junction.

5. A device as claimed in claim 1, wherein said device comprises a face from which there emanates the radiation emitted by the first junction and said third region surface is disposed opposite to said face, said zones and regions of said device being layers present one above the other, and said fourth region extending across a smaller distance than the other said regions.

6. A device as claimed in claim 1, wherein said device comprises a face from which there emanates the radiation emitted by said first junction and said surface is disposed at said face.

7. A device as claimed in claim 1, wherein said device comprises a face from which there emanates the radiation emitted by said first junction and said surface is disposed beside said face.

8. A device as claimed in claim 1, wherein said first region and said first zone of said second region consist essentially of a highly doped material having a direct band structure, said first zone constituting an absorbing layer for the radiation emitted by the first junction.

9. A device as claimed in claim 1, consisting essentially of both at least one of gallium, aluminum, and indium and at least one of arsenic and phosphorus.

10. A device as claimed in claim 9, wherein said first region comprises a zinc-doped epitaxial deposit consisting of essentially of gallium arsenide having the formula $GaAs_{1-x}P_x$, in which $0 < x < 0.4$, said first zone of said second region comprising a tellurium-doped epitaxial deposit consisting essentially of gallium arsenide phosphide wherein the phosphide proportion varies between $x$ and 9, said second zone of said second region consisting essentially of tellurium-doped gallium arsenide, said third region consisting essentially of zinc-doped gallium arsenide and said fourth region consisting essentially of tin-doped gallium arsenide.

* * * * *